(12) United States Patent
Murakami et al.

(10) Patent No.: US 11,075,613 B2
(45) Date of Patent: Jul. 27, 2021

(54) VIBRATOR DEVICE, ELECTRONIC APPARATUS, AND VEHICLE

(71) Applicant: SEIKO EPSON CORPORATION, Tokyo (JP)

(72) Inventors: Shiro Murakami, Shiojiri (JP); Atsushi Matsuo, Shiojiri (JP); Shinya Aoki, Minowa-machi (JP); Masashi Shimura, Chino (JP); Ryuta Nishizawa, Nagano (JP)

(73) Assignee: SEIKO EPSON CORPORATION, Tokyo (JP)

( * ) Notice: Subject to any disclaimer, the term of this patent is extended or adjusted under 35 U.S.C. 154(b) by 448 days.

(21) Appl. No.: 16/202,503

(22) Filed: Nov. 28, 2018

(65) Prior Publication Data
US 2019/0165756 A1 May 30, 2019

(30) Foreign Application Priority Data

Nov. 29, 2017 (JP) .............................. JP2017-228724

(51) Int. Cl.
| | |
|---|---|
| *H03H 9/02* | (2006.01) |
| *H03H 9/05* | (2006.01) |
| *H03H 9/13* | (2006.01) |
| *H03H 9/19* | (2006.01) |
| *G06F 1/16* | (2006.01) |
| *H03H 9/10* | (2006.01) |
| *B60Q 9/00* | (2006.01) |
| *B60C 9/00* | (2006.01) |

(52) U.S. Cl.
CPC ....... *H03H 9/02133* (2013.01); *G06F 1/1613* (2013.01); *H03H 9/0519* (2013.01); *H03H 9/0547* (2013.01); *H03H 9/0552* (2013.01); *H03H 9/1021* (2013.01); *H03H 9/132* (2013.01); *H03H 9/19* (2013.01); *B60C 9/00* (2013.01); *H03H 9/02023* (2013.01)

(58) Field of Classification Search
CPC .. H03H 9/132; H03H 9/02133; H03H 9/0519; H03H 9/0552; H03H 9/19; H03H 9/1021; H03H 3/04; H03H 2003/0457
See application file for complete search history.

(56) References Cited

U.S. PATENT DOCUMENTS

2013/0221801 A1* 8/2013 Shimodaira ......... H01L 41/0475
    310/317
2013/0335157 A1 12/2013 Ishii et al.

FOREIGN PATENT DOCUMENTS

| JP | 2013-258571 A | 12/2013 |
|---|---|---|
| JP | 2016-220179 A | 12/2016 |

* cited by examiner

*Primary Examiner* — Jeffrey M Shin
(74) *Attorney, Agent, or Firm* — Oliff PLC

(57) ABSTRACT

A vibrator device includes a base, a relay substrate that is supported by the base, and a vibrator element that is supported by the relay substrate. In addition, the vibrator element includes a vibration substrate formed of a piezoelectric single-crystalline body and an excitation electrode disposed on the vibration substrate. In addition, the relay substrate includes a substrate formed of the piezoelectric single-crystalline body. A crystal axis of the substrate and a crystal axis of the vibration substrate are shifted from each other.

10 Claims, 14 Drawing Sheets

VIBRATOR DEVICE, ELECTRONIC APPARATUS, AND VEHICLE

BACKGROUND

1. Technical Field

The present invention relates to a vibrator device, an electronic apparatus, and a vehicle.

2. Related Art

A vibrator device disclosed in JP-A-2016-220179 includes a package, and a vibrator element and a relay substrate which are accommodated in the package. The vibrator element is fixed to the package through a relay substrate. In addition, the vibrator element and the relay substrate are all formed of quartz crystal and are disposed so that mutual crystal axes are consistent with each other. With such a configuration, deformation such as thermal deflection of the package is hardly transmitted to the vibrator element, and thus it is possible to suppress the deterioration of vibration characteristics.

However, in the vibrator device disclosed in JP-A-2016-220179, as described above, the vibrator element and the relay substrate are all formed of quartz crystal and are disposed so that mutual crystal axes are consistent with each other. For this reason, mechanical resonance points (resonance frequencies) of the vibrator element and the relay substrate easily approach each other, and unintended vibration occurs in the relay substrate when the vibrator element is excited, which leads to a concern that the vibration exerts an adverse effect on vibration characteristics of the vibrator element.

SUMMARY

An advantage of some aspects of the invention is to provide a vibrator device having excellent vibration characteristics by separating mechanical resonance points of a vibrator element and a relay substrate from each other, an electronic apparatus, and a vehicle.

The invention can be implemented as the following application examples.

A vibrator device according to an application example includes a base, a relay substrate that is supported by the base, and a vibrator element that is supported by the relay substrate, in which the vibrator element includes a vibration substrate formed of a piezoelectric single-crystalline body and an excitation electrode disposed on the vibration substrate, the relay substrate includes a substrate formed of the piezoelectric single-crystalline body, and a crystal axis of the substrate and a crystal axis of the vibration substrate are shifted from each other.

With this configuration, it is possible to separate mechanical resonance points of the vibrator element and the relay substrate from each other with a relatively simple configuration, and to effectively reduce the occurrence of unintended vibration in the relay substrate when the vibrator element is excited. For this reason, it is possible to reduce the deterioration of vibration characteristics of the vibrator element and to exhibit excellent vibration characteristics.

In the vibrator device according to the application example, it is preferable that a cut angle of the substrate and a cut angle of the vibration substrate are different from each other.

With this configuration, it is possible to simply shift crystal axis of the relay substrate and the crystal axis of the vibration substrate from each other.

In the vibrator device according to the application example, it is preferable that the substrate is constituted by a Z cut quartz crystal substrate.

With this configuration, the vibrator device particularly has excellent accuracy of processing of the relay substrate.

In the vibrator device according to the application example, it is preferable that the substrate includes a first portion that is supported by the base, a second portion, a first beam portion that connects the first portion and the second portion to each other on a first axis, a third portion, and a second beam portion that connects the second portion and the third portion to each other on a second axis intersecting the first axis, and the vibrator element is supported by the third portion.

With this configuration, stress is more hardly transmitted to the vibrator element.

In the vibrator device according to the application example, it is preferable that the relay substrate includes a wiring disposed in the substrate, and the wiring is electrically connected to the excitation electrode.

With this configuration, the excitation electrode is easily led to the base.

It is preferable that the vibrator device according to the application example further includes a lid body that is bonded to the base so as to accommodate the vibrator element and the relay substrate between the base and the lid body.

With this configuration, it is possible to protect the vibrator element from the outside world (moisture, dust, an impact, and the like).

It is preferable that the vibrator device according to the application example further includes a circuit element that is supported by the base and is electrically connected to the vibrator element, and the relay substrate is supported by the base through the circuit element.

With this configuration, stress is further hardly transmitted to the vibrator element. In addition, it is possible to suitably use the vibrator device as an oscillator.

In the vibrator device according to the application example, it is preferable that the circuit element, the relay substrate, and the vibrator element are disposed so as to overlap each other when viewed in a plan view.

With this configuration, it is possible to achieve the miniaturization of the vibrator device.

An electronic apparatus according to an application example includes the vibrator device according to the above-described application example.

With this configuration, it is possible to enjoy the effect of the vibrator device of the above-described application example, and thus the electronic apparatus having high reliability is obtained.

A vehicle according to an application example includes the vibrator device according to the above-described application example.

With this configuration, it is possible to enjoy the effect of the vibrator device of the above-described application example, and thus the vehicle having high reliability is obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a vibrator device, an electronic apparatus, and a vehicle according to the invention will be described in detail on the basis of embodiments illustrated in the accompanying drawings.

First Embodiment

Figure 1:
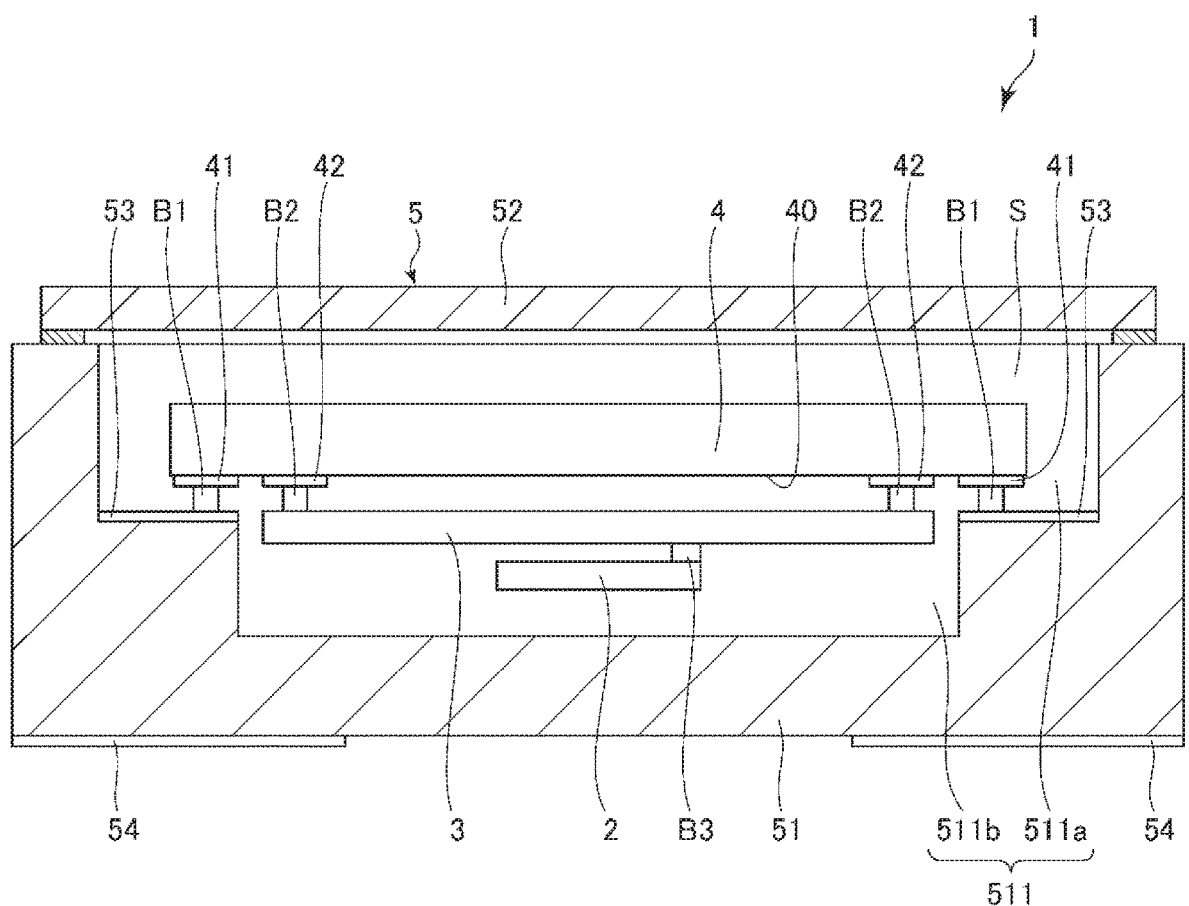
FIG. 1 is a cross-sectional view illustrating a vibrator device according to a first embodiment of the invention.
Figure 2:
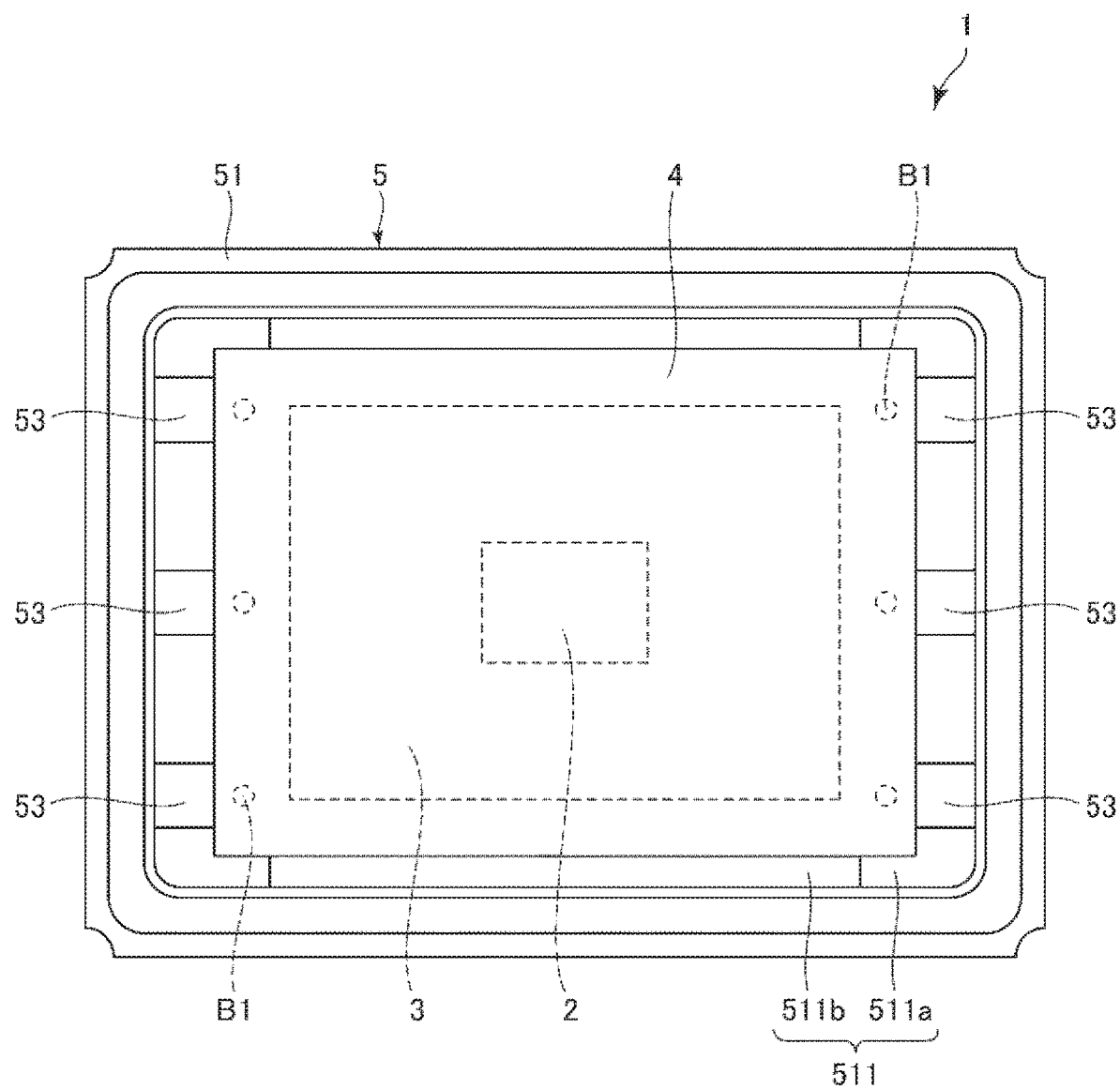
FIG. 2 is a top view illustrating the vibrator device of FIG. 1.
Figure 3:
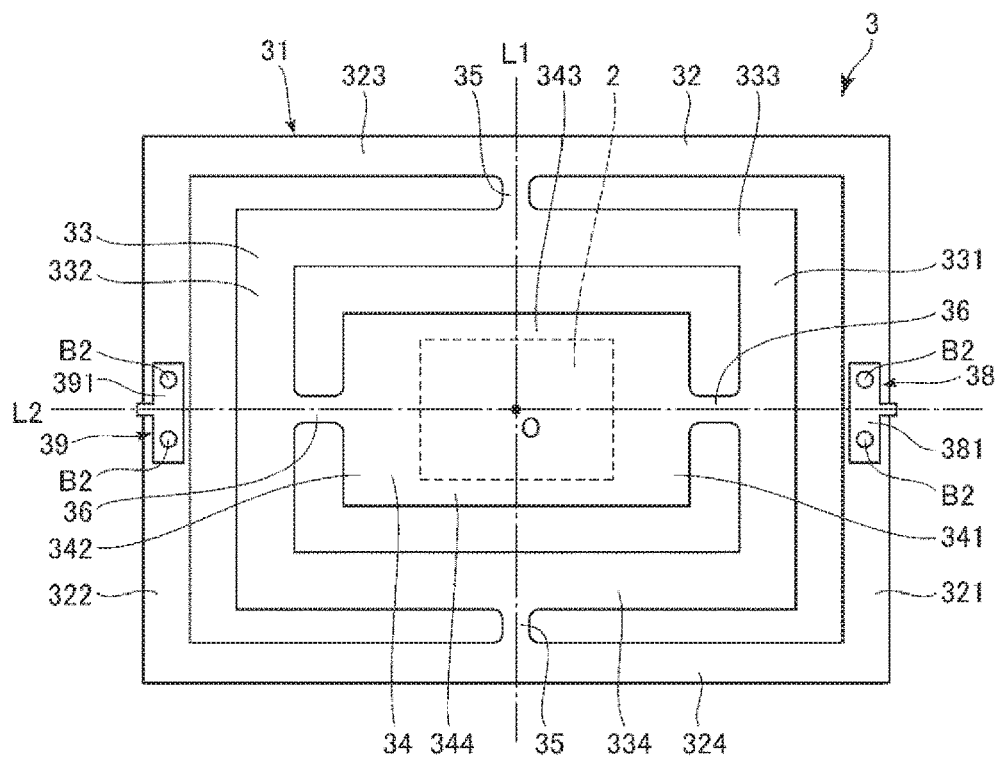
FIG. 3 is a top view illustrating a relay substrate.
Figure 4:
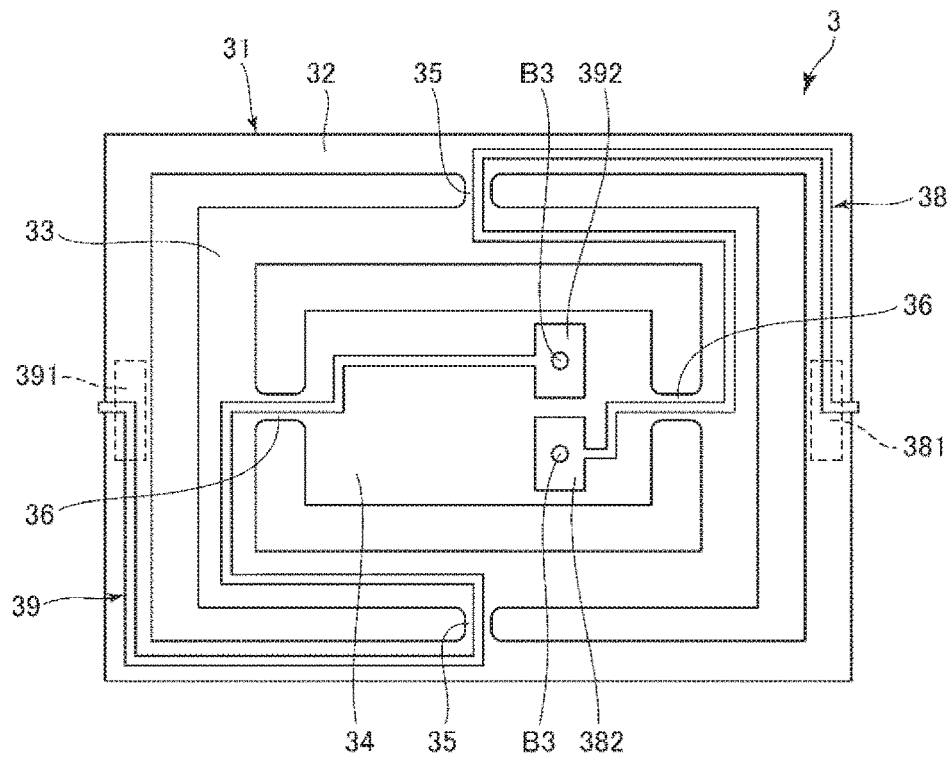
FIG. 4 is a bottom view illustrating the relay substrate.
Figure 5:
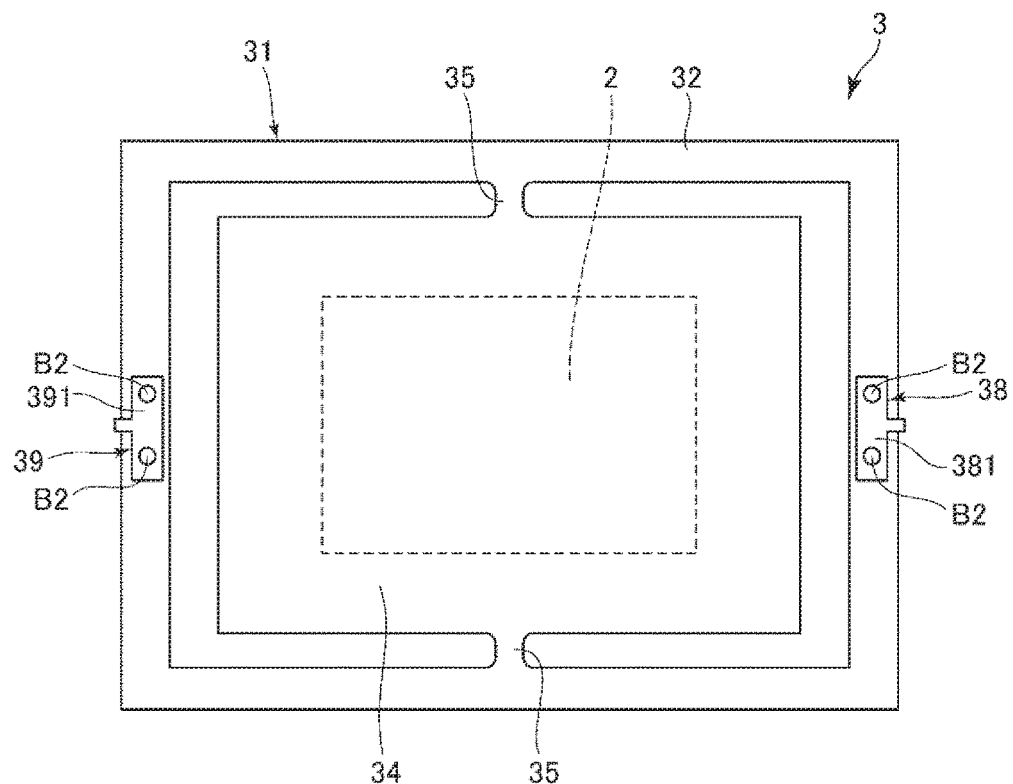
FIG. 5 is a top view illustrating a modification example of the relay substrate.
Figure 6:
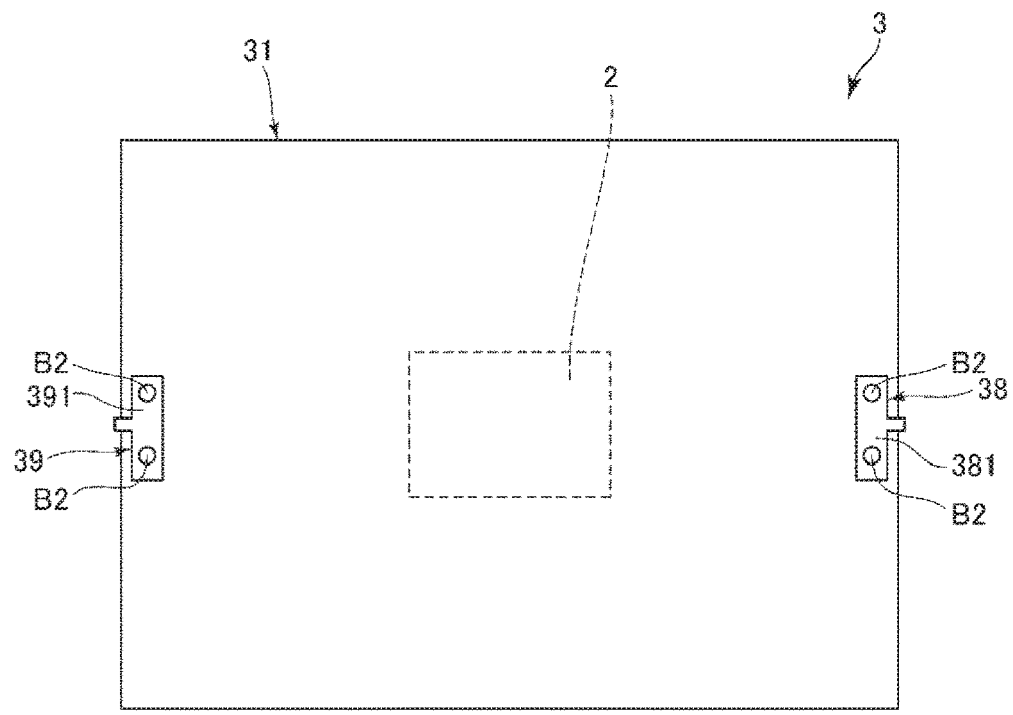
FIG. 6 is a top view illustrating a modification example of the relay substrate.
Figure 7:
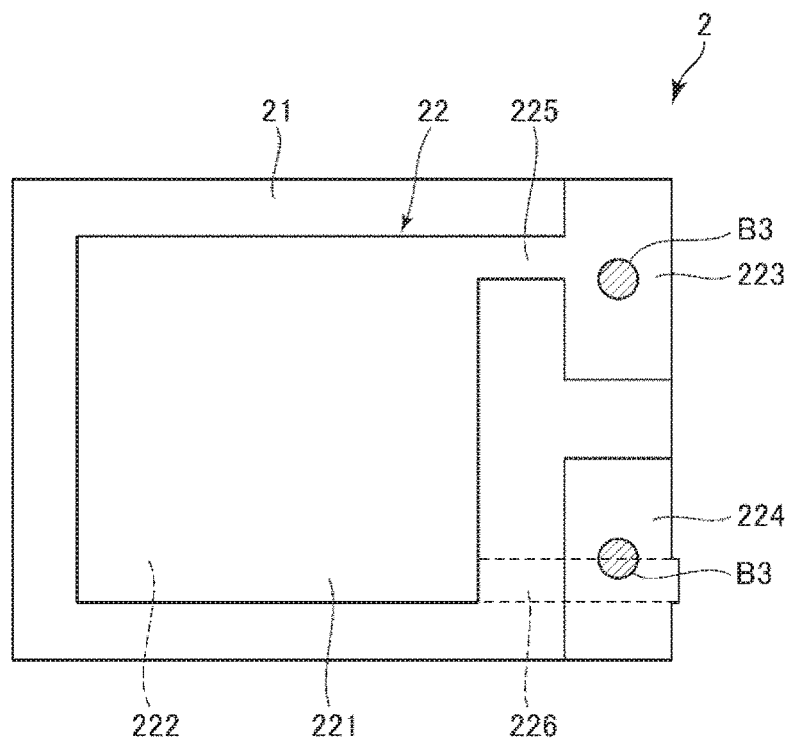
FIG. 7 is a top view illustrating a vibrator element.
Figure 8:
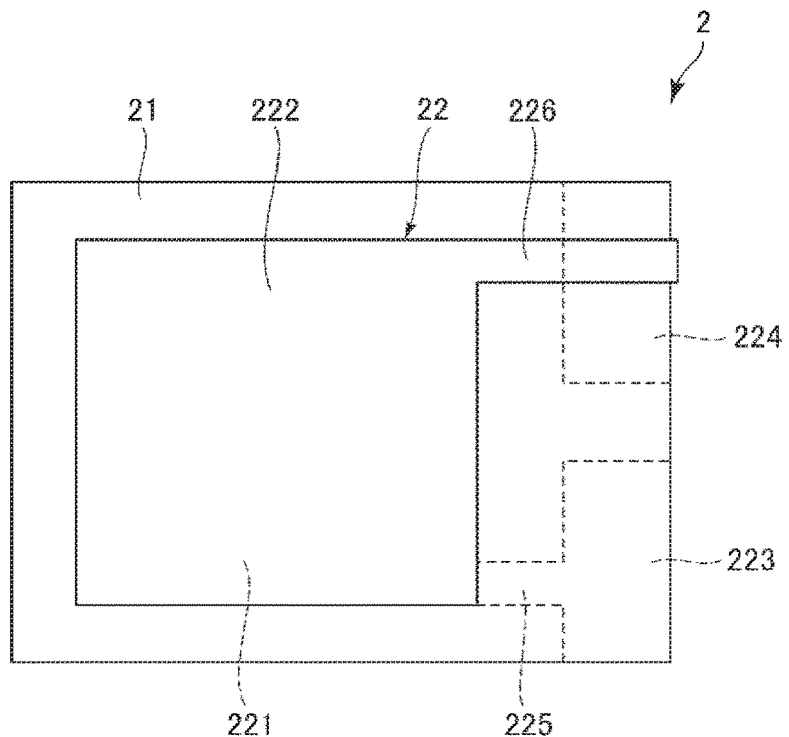
FIG. 8 is a bottom view illustrating the vibrator element.
Figure 9:
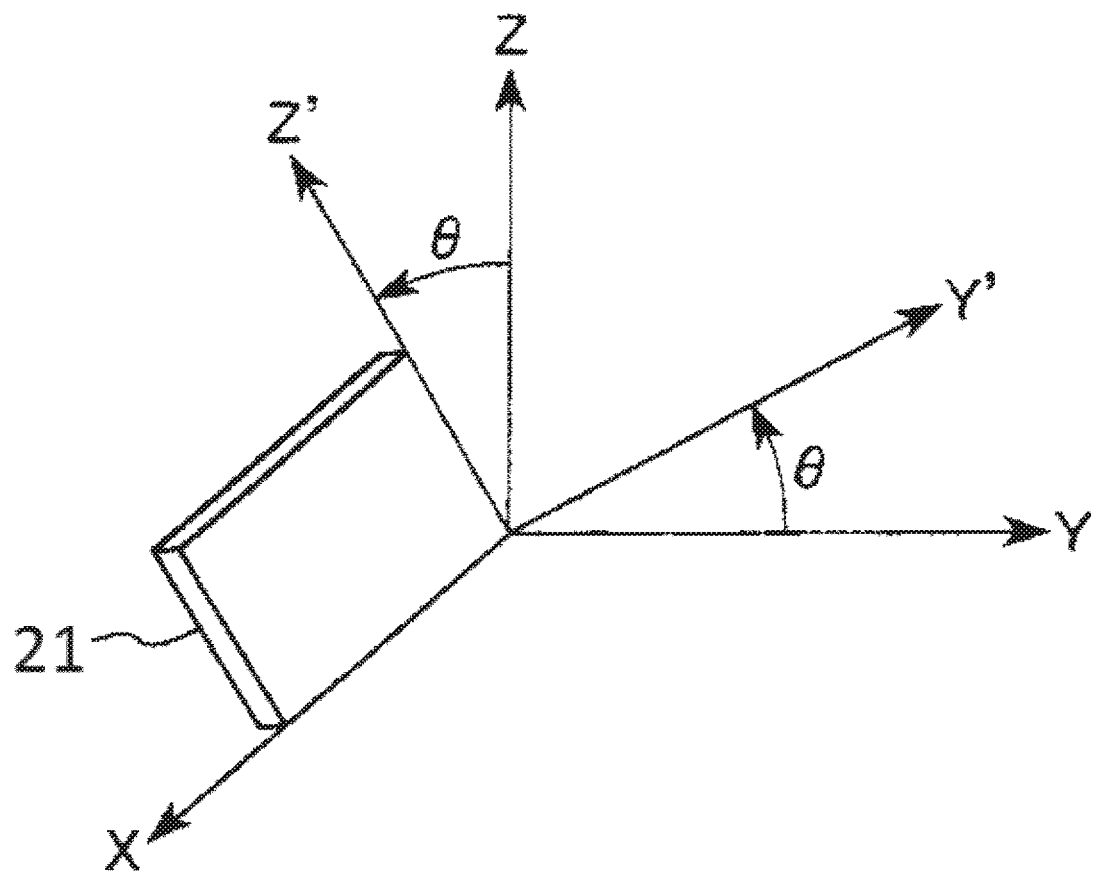
FIG. 9 is a diagram illustrating a cut angle of quartz crystal.
Figure 10:
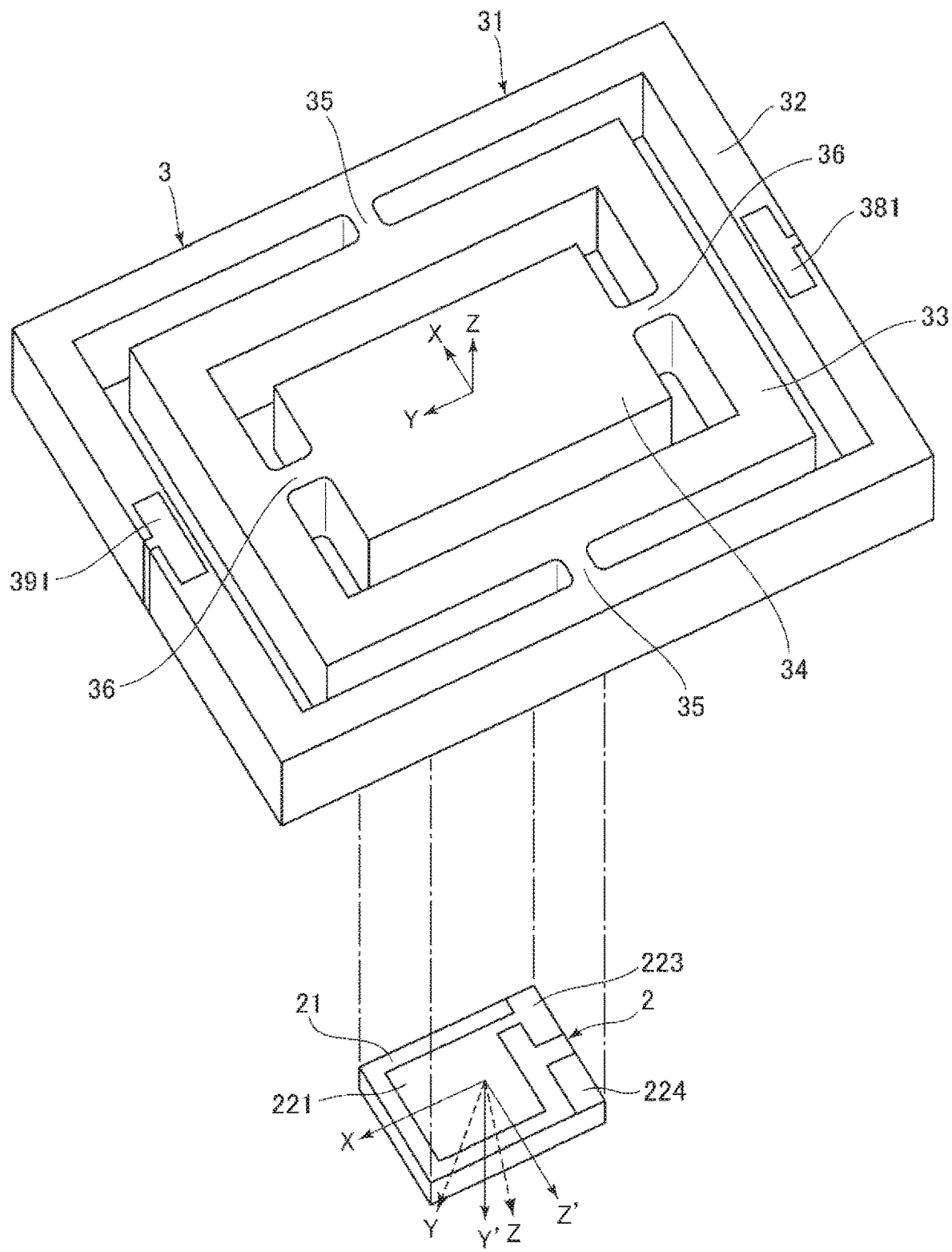
FIG. 10 is a perspective view illustrating a relationship between crystal axes of the relay substrate and the vibrator element.
Figure 11:
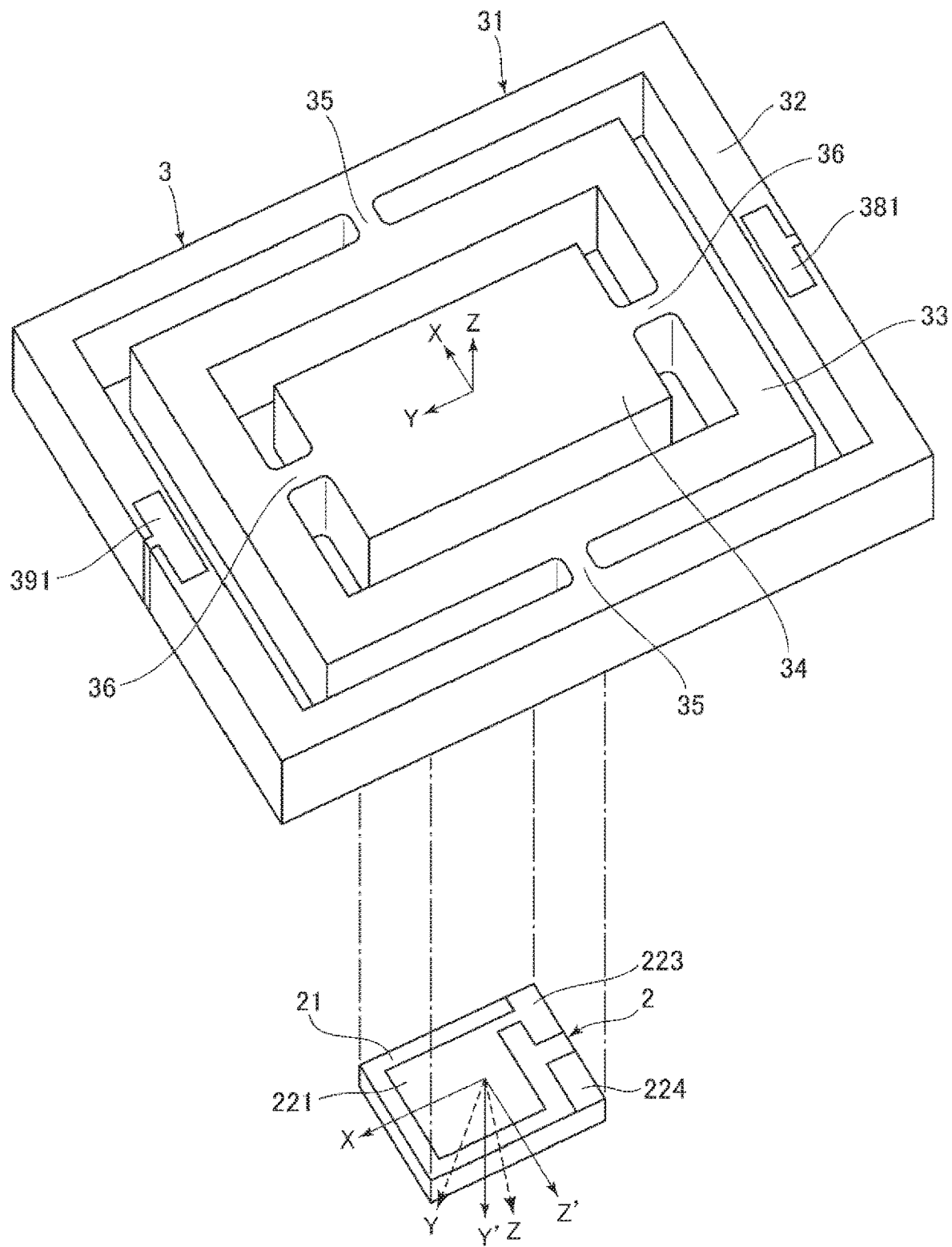
FIG. 11 is a perspective view illustrating a relationship between crystal axes of the relay substrate and the vibrator element.

FIG. 1 is a cross-sectional view illustrating a vibrator device according to a first embodiment of the invention. FIG. 2 is a top view illustrating the vibrator device of FIG. 1. FIG. 3 is a top view illustrating a relay substrate. FIG. 4 is a bottom view illustrating the relay substrate. FIGS. 5 and 6 are top views illustrating a modification example of the relay substrate. FIG. 7 is a top view illustrating a vibrator element. FIG. 8 is a bottom view illustrating the vibrator element. FIG. 9 is a diagram illustrating a cut angle of quartz crystal. FIGS. 10 and 11 are perspective views illustrating a relationship between crystal axes of the relay substrate and the vibrator element. Meanwhile, hereinafter, for convenience of description, the upper side in FIG. 1 will also be referred to as "top", and the lower side will also be referred to as "bottom". In addition, a description will be given on the assumption that the crystal axes of quartz crystal are an X-axis (electric axis), a Y-axis (mechanical axis), and a Z-axis (optical axis).

As illustrated in FIGS. 1 and 2, a vibrator device 1 includes a vibrator element 2, a relay substrate 3, a circuit element 4, and a package 5 accommodating these components. In the package 5, the relay substrate 3 is positioned below the circuit element 4, the vibrator element 2 is positioned below the relay substrate 3, and the circuit element 4, the relay substrate 3, and the vibrator element 2 are disposed so as to overlap each other in the thickness direction of the package 5. In this manner, it is possible to suppress planar expansion of the vibrator device 1 and to achieve the miniaturization of the vibrator device 1 by disposing the circuit element 4, the relay substrate 3, and the vibrator element 2 so as to overlap each other. In addition, the vibrator element 2 is supported by the relay substrate 3, the relay substrate 3 is supported by the circuit element 4, and the circuit element 4 is supported by the package 5. In this manner, deformation (stress) due to, for example, thermal deflection of the package 5 is hardly transmitted to the vibrator element 2 by interposing the circuit element 4 and the relay substrate 3 between the package 5 and the vibrator element 2, and thus it is possible to suppress the deterioration of vibration characteristics of the vibrator element 2. Hereinafter, the portions of the vibrator device 1 will be sequentially described in detail.

Package

As illustrated in FIG. 1, the package 5 has a storage space S therein, and the vibrator element 2, the relay substrate 3, and the circuit element 4 are accommodated in the storage space S. For this reason, it is possible to suitably protect the vibrator element 2, the relay substrate 3, and the circuit element 4 by the package 5 from an impact, dust, heat, humidity (moisture), and the like. The package 5 includes a base 51 that supports the vibrator element 2, the relay substrate 3, and the circuit element 4, and a lid 52 which is bonded to the upper surface of the base 51 so as to form the storage space S between the base 51 and the lid 52.

The base 51 has a cavity shape having a concave portion 511 opening on the upper surface thereof. In addition, the concave portion 511 includes a first concave portion 511a opening on the upper surface of the base 51, and a second concave portion 511b opening on the bottom surface of the first concave portion 511a. On the other hand, the lid 52 has a plate shape, and is bonded to the upper surface of the base 51 so as to close the opening of the concave portion 511. In this manner, the storage space S is formed by closing the opening of the concave portion 511 by the lid 52, and the vibrator element 2, the relay substrate 3, and the circuit element 4 are accommodated in the storage space S. The storage space S is airtightly sealed, and is set to be in a reduced pressure state (preferably, a state closer to vacuum). Thereby, it is possible to stably drive the vibrator element 2. However, the atmosphere of the storage space S is not particularly limited, and may be, for example, atmospheric pressure.

A constituent material of the base 51 is not particularly limited, and various ceramics such as an aluminum oxide can be used. In this case, it is possible to manufacture the base 51 by firing a laminated body of a ceramic sheet (green sheet). On the other hand, a constituent material of the lid 52 is not particularly limited, but the lid 52 may be a member having a linear expansion coefficient approximate to that of the constituent material of the base 51. For example, in a case where a constituent material of the base 51 is the above-described ceramics, it is preferable that the lid 52 is formed of an alloy such as Kovar.

In addition, the base 51 includes a plurality of internal terminals 53 disposed on the bottom surface of the first concave portion 511a, and a plurality of external terminals 54 disposed on the bottom surface of the base 51. The plurality of internal terminals 53 are electrically connected to the predetermined external terminals 54, respectively, through an internal wiring, not shown in the drawing, which is formed inside the base 51. In addition, the plurality of internal terminals 53 are electrically connected to the circuit element 4 through conductive connection bumps B1.

Circuit Element

The circuit element 4 is, for example, a semiconductor circuit substrate in which various circuit elements are formed on a silicon substrate, and is disposed within the package 5 with an active surface 40 facing downward, as illustrated in FIG. 1. The circuit element 4 is fixed to the upper surface of the first concave portion 511a of the package 5 through the conductive connection bump B1. In addition, the circuit element 4 includes a plurality of terminals 41 and 42 disposed on the active surface 40. Among these, the plurality of terminals 41 are electrically connected to the predetermined internal terminals 53 through the connection bumps B1, respectively. The circuit element 4 includes, for example, an oscillation circuit that oscillates the vibrator element 2.

Meanwhile, the connection bump B1 is not particularly limited as long as the connection bump has conductivity and bondability, but it is preferable to use various metal bumps such as a gold bump, a silver bump, and a copper bump. Thereby, an out gas from the connection bump B1 is prevented, and thus it is possible to effectively suppress environmental changes (particularly, an increase in pressure) in the storage space S.

Relay Substrate

As illustrated in FIG. 1, the relay substrate 3 is interposed between the circuit element 4 and the vibrator element 2. The relay substrate 3 mainly has a function of making it difficult for stress caused by the deformation of the package 5 and the circuit element 4 to be transmitted to the vibrator element 2.

As illustrated in FIGS. 3 and 4, the relay substrate 3 includes a substrate 31 and a pair of wirings 38 and 39 disposed on the substrate 31. The substrate 31 has a gimbal shape. Specifically, the substrate 31 includes a frame-shaped supporting portion 32 fixed to the circuit element 4, a frame-shaped first swing portion 33 positioned on the inner side of the supporting portion 32, a second swing portion 34 positioned on the inner side of the first swing portion 33 and having the vibrator element 2 fixed thereto, a pair of beam portions 35 connecting the supporting portion 32 and the first swing portion 33 to each other, and a pair of beam portions 36 connecting the first swing portion 33 and the second swing portion 34 to each other.

The supporting portion 32 has a rectangular frame shape, and includes four edge portions 321, 322, 323, and 324. The supporting portion 32 is fixed to the active surface 40 of the circuit element 4 through two connection bumps B2 at center portions of the edge portions 321 and 322 facing each other (positioned on the opposite sides with respect to a center O) in the extension direction. In this manner, the posture of the relay substrate 3 is stabilized by fixing both sides of the supporting portion 32 to the circuit element 4, and thus it is possible to suppress unnecessary displacement, vibration, and the like of the relay substrate 3. However, the number and arrangement of the connection bumps B2 are not particularly limited, and the connection bumps B2 may be disposed, for example, at the respective corner portions of the supporting portion 32.

Meanwhile, the connection bump B2 is not particularly limited as long as the connection bump has conductivity and bondability, but it is preferable to use various metal bumps such as a gold bump, a silver bump, and a copper bump. Thereby, the out gas from the connection bump B2 is prevented, and thus it is possible to effectively suppress environmental changes (particularly, an increase in pressure) in the storage space S.

In addition, the first swing portion 33 positioned on the inner side of the supporting portion 32 has a rectangular plate shape, and includes four edge portions 331, 332, 333, and 334. In addition, the second swing portion 34 positioned on the inner side of the first swing portion 33 has a rectangular frame shape, and has four edge portions 341, 342, 343, and 344. The vibrator element 2 is fixed to the lower surface of the second swing portion 34 through a conductive connection bump B3.

In addition, the pair of beam portions 35 are positioned on both sides of the first swing portion 33, and connect the first swing portion 33 and the supporting portion 32 to each other so as to support the first swing portion 33 at both sides thereof. Specifically, one beam portion 35 connects the center portions of the edge portions 323 and 333 in the extension direction, and the other beam portion 35 connects the center portions of the edge portions 324 and 334 in the extension direction. For this reason, the first swing portion 33 is swingable around a first axis L1 (a line segment connecting the pair of beam portions 35 to each other) which is formed by the pair of beam portions 35 with respect to the supporting portion 32.

In addition, the pair of beam portions 36 are positioned on both sides of the second swing portion 34, and connect the second swing portion 34 and the first swing portion 33 to each other so as to support the second swing portion 34 at both sides thereof. Specifically, one beam portion 36 connects the center portions of the edge portions 331 and 341 in the extension direction, and the other beam portion 36 connects the center portions of the edge portions 332 and 342 in the extension direction. For this reason, the second swing portion 34 is swingable around a second axis L2 (a line segment connecting the pair of beam portions 36 to each other) which is formed by the pair of beam portions 36 and intersects the first axis L1 with respect to the first swing portion 33.

According to the substrate 31 configured in such a manner, it is possible to meander a transmission path of stress from the supporting portion 32 fixed to the circuit element 4 to the second swing portion 34 to which the vibrator element 2 is fixed, and thus it is possible to secure the transmission path as long as possible. For this reason, stress caused by the deformation of the package 5 and the circuit element 4 is effectively absorbed and alleviated between the supporting portion 32 and the second swing portion 34, and thus it is possible to effectively suppress the transmission of the stress to the vibrator element 2 on the second swing portion 34. For this reason, a change in driving characteristics of the vibrator element 2 (particularly, a fluctuation in a resonance frequency) hardly occurs, and thus the vibrator element 2 can exhibit excellent vibration characteristics.

Particularly, in this embodiment, the first axis L1 and the second axis L2 are perpendicular to each other when viewed in a plan view of the relay substrate 3, and an intersection between the first axis L1 and the second axis L2 is consistent with the center O of the substrate 31. Thereby, the first swing portion 33 is supported by the supporting portion 32 in a well-balanced manner, and the second swing portion 34 is supported by the first swing portion 33 in a well-balanced manner. As a result, it is possible to effectively suppress the swing of the vibrator element 2 fixed to the second swing portion 34.

The above-described substrate 31 is formed of quartz crystal and is formed by patterning a quartz crystal substrate through etching (particularly, wet etching). In this embodiment, the substrate 31 is constituted by a Z cut quartz crystal substrate, and the normal lines of both principal surfaces of the substrate 31 are consistent with a Z-axis (optical axis) which is a crystal axis of quartz crystal. Since etching for the Z-axis (optical axis) proceeds preferentially as compared to the X-axis (electric axis) and the Y-axis (mechanical axis) which are the other crystal axes of quartz crystal, it is possible to reduce an etching time by constituting the substrate 31 by a Z cut quartz crystal substrate. In addition, an etching surface (a side surface formed by the etching) becomes steeper, and thus it is possible to form the relay substrate 3 with excellent dimensional accuracy. Meanwhile, the substrate 31 is not particularly limited, and may be constituted by a quartz crystal substrate, for example, an X cut quartz crystal substrate, a Y cut quartz crystal substrate, an AT cut quartz crystal substrate, a BT cut quartz crystal substrate, an SC cut quartz crystal substrate, an ST cut quartz crystal substrate, or the like, other than the Z cut quartz crystal substrate.

Meanwhile, the Z cut quartz crystal substrate refers to a substrate of which a cut-off surface (principal surface 10a) is substantially perpendicular to the Z-axis, and the principal surface 10a perpendicular to the Z-axis also includes a surface cut off in a rotated state in a range from 0 degrees to several degrees clockwise or counterclockwise in a direction from the Y-axis to the Z-axis when viewed from the positive side of the X-axis.

The wiring 38 is wound around the supporting portion 32 and the second swing portion 34, and is configured such that one end thereof serves as a terminal 381 positioned at the supporting portion 32 and the other end serves as a terminal 382 positioned at the second swing portion 34. Similarly, the wiring 39 is wound around the supporting portion 32 and the second swing portion 34, and is configured such that one end thereof serves as a terminal 391 positioned at the supporting portion 32 and the other end serves as a terminal 392 positioned at the second swing portion 34. The terminals 381 and 391 are electrically connected to the terminals 42 of the circuit element 4 through the connection bumps B2, respectively, and the terminals 382 and 392 are electrically connected to the vibrator element 2 through the conductive connection bump B3. In this manner, the relay substrate 3 includes the wirings 38 and 39, so that electrical connection between the vibrator element 2 and the circuit element 4 is facilitated.

Although the relay substrate 3 has been described above, the configuration of the relay substrate 3 is not limited to the above-described configuration. For example, as illustrated in FIG. 5, the substrate 31 may be configured such that the first swing portion 33 and the beam portions 36 are omitted and the second swing portion 34 is connected to the supporting portion 32 through the beam portions 35. In addition, as illustrated in FIG. 6, the substrate 31 may have a single plate shape instead of a gimbal shape. In addition, each of the supporting portion 32 and the first swing portion has a circular shape, but a portion thereof in the circumferential direction may be lost. In addition, the first and second axes L1 and L2 may not be perpendicular to each other (that is, the axes may intersect each other at an angle other than 90 degrees), and the intersection between the first and second axes L1 and L2 may not be consistent with the center O of the substrate 31. In addition, one of the pair of beam portions 35 may be omitted, or one of the pair of beam portions 36 may be omitted. Further, in this embodiment, the first swing portion 33 is swingable with respect to the supporting portion 32, and the second swing portion 34 is swingable with respect to the first swing portion 33, but the invention is not limited thereto. For example, the beam portion 35 may be hard and the first swing portion 33 may not be substantially swingable with respect to the supporting portion 32, and the beam portion 36 may be hard and the second swing portion 34 may not be substantially swingable with respect to the first swing portion 33.

Further, in this embodiment, the substrate 31 is formed of quartz crystal, but a constituent material of the substrate 31 is not limited thereto. For example, the substrate 31 may be constituted by a piezoelectric single-crystalline body (a piezoelectric material of a single-crystalline body) such as lithium niobate, lithium tantalate, lithium tetraborate, rangarite, potassium niobate, or gallium phosphate, or may be constituted by any of other piezoelectric single-crystalline bodies.

Vibrator Element

The vibrator element 2 includes a vibration substrate 21 constituted by a quartz crystal substrate and an electrode 22 disposed on the vibration substrate 21, as illustrated in FIGS. 7 and 8. The vibration substrate 21 has a thickness slip vibration mode, and is constituted by an AT cut quartz crystal substrate in this embodiment. As illustrated in FIG. 9, the AT cut quartz crystal substrate is "a rotated Y cut quartz crystal substrate" which is cut along a plane obtained by rotating an XZ plane around the X-axis at an angle θ (=35° 15'). Since the AT cut quartz crystal substrate has a third-order frequency-temperature characteristic, the vibration substrate 21 is constituted by the AT cut quartz crystal substrate, so that the vibrator element 2 having an excellent temperature characteristic is obtained. Meanwhile, hereinafter, the Y-axis and the Z-axis rotated around the X-axis in response to the angle θ are set to be a Y'-axis and a Z'-axis. That is, the vibration substrate 21 has a thickness in the Y'-axis direction and a width in a direction of an XZ' plane.

The electrode 22 includes an excitation electrode 221 disposed on the upper surface (one principal surface) of the vibration substrate 21, and an excitation electrode 222 disposed on the lower surface (the other principal surface) thereof so as to face the excitation electrode 221. In addition, the electrode 22 includes a pair of terminals 223 and 224 disposed on the upper surface of the vibration substrate 21, a wiring 225 electrically connecting the terminal 223 and the excitation electrode 221, and a wiring 226 electrically connecting the terminal 224 and the excitation electrode 222. Thickness slip vibration of the vibration substrate 21 occurs by applying a driving signal (alternating voltage) between the excitation electrodes 221 and 222.

The vibrator element 2 is fixed to the second swing portion 34 of the relay substrate 3 through the pair of conductive connection bumps B3. In addition, the terminal 223 of the vibrator element 2 and the terminal 382 of the relay substrate 3 are electrically connected to each other through one connection bump B3, and the terminal 224 of the vibrator element 2 and the terminal 392 of the relay substrate 3 are electrically connected to each other through the other connection bump B3. For this reason, the vibrator element 2 is electrically connected to the circuit element 4 through the wirings 38 and 39 of the relay substrate 3.

Although the vibrator element 2 has been described, the configuration of the vibrator element 2 is not limited to the above-described configuration. For example, the vibrator element 2 may have a mesa shape in which a vibration region (a region sandwiched between the excitation electrodes 221 and 222) of the vibration substrate 21 protrudes from the vicinity thereof, and conversely, may have an inverted mesa shape in which the vibration region is recessed from the vicinity thereof. In addition, beveling for grinding the vicinity of the vibration substrate 21 or convex processing for forming the upper surface and the lower surface as curved convex surfaces may be applied. In addition, the vibrator element 2 is not limited to an element that vibrates in a thickness slip vibration mode. For example, the vibrator element 2 may be configured such that flexural vibration (tuning fork vibration) of a plurality of vibrating arms occurs in an in-plane direction or flexural vibration (walk vibration) of a plurality of vibrating arms occurs in an out-of-plane direction. Therefore, the vibration substrate 21 is not limited to a substrate constituted by an AT cut quartz crystal substrate, and may be constituted by a quartz crystal substrate other than the AT cut quartz crystal substrate, for example, an X cut quartz crystal substrate, a Y cut quartz crystal substrate, a Z cut quartz crystal substrate, a BT cut quartz crystal substrate, an SC cut quartz crystal substrate, an ST cut quartz crystal substrate, or the like.

Here, as described above, each of the substrate 31 of the relay substrate 3 and the vibration substrate 21 of the vibrator element 2 are formed of quartz crystal. However, in the vibrator device 1, the crystal axis of the substrate 31 and the crystal axis of the vibration substrate 21 are shifted from each other as illustrated in FIG. 10. That is, the X-axis of the substrate 31 extends in a direction different from that of the X-axis of the vibration substrate 21, the Y-axis of the substrate 31 extends in a direction different from that of the Y-axis of the vibration substrate 21, and the Z-axis of the substrate 31 extends in a direction different from that of the Z-axis of the vibration substrate 21. Thereby, it is possible to separate the mechanical resonance points (resonance frequencies) of the vibration substrate 21 and the substrate 31 from each other, for example, as compared to a case where the crystal axes of the vibration substrate 21 and the substrate 31 are consistent with each other. For this reason, it is possible to suppress the occurrence of unintended vibration on the relay substrate 3 so as to resonate with the vibration of the vibrator element 2, and to effectively suppress the deterioration of vibration characteristics of the vibrator element 2 due to the vibration of the relay substrate 3.

Particularly, in this embodiment, the X-axis of the substrate 31 is inclined around both the Y-axis and the Z-axis with respect to the X-axis of the vibration substrate 21, the Y-axis of the substrate 31 is inclined around both the X-axis and the Z-axis with respect to the Y-axis of the vibration substrate 21, and the Z-axis of the substrate 31 is inclined around both the X-axis and the Y-axis with respect to the Z-axis of the vibration substrate 21. That is, the crystal axis of the substrate 31 and the crystal axis of the vibration substrate are in a twisted relationship. For this reason, the above-described effect becomes more remarkable, and the mechanical resonance points (resonance frequencies) of the vibration substrate 21 and the substrate 31 can be further separated from each other. Therefore, it is possible to more effectively suppress the occurrence of unintended vibration on the relay substrate 3 so as to resonate with the vibration of the vibrator element 2, and to more effectively suppress the deterioration of vibration characteristics of the vibrator element 2 due to the vibration of the relay substrate 3.

In this embodiment, as described above, a cut angle of the vibration substrate 21 and a cut angle of the substrate 31 are different from each other. Specifically, the vibration substrate 21 of the vibrator element 2 is constituted by an AT cut quartz crystal substrate, and thus the substrate 31 of the relay substrate 3 is constituted by a Z cut quartz crystal substrate different from the AT cut quartz crystal substrate. In this manner, it is possible to simply and reliably shift the crystal axis of the substrate 31 and the crystal axis of the vibration substrate 21 from each other by making the cut angle of the vibration substrate 21 and the cut angle of the substrate 31 different from each other.

Meanwhile, in this embodiment, the X-axis, the Y-axis, and the Z-axis of the substrate 31 are inclined to the X-axis, the Y-axis, and the Z-axis of the vibration substrate 21, respectively, but the invention is not limited thereto. For example, when two axes among the X-axis, the Y-axis, and the Z-axis of the substrate 31 are inclined with respect to the corresponding axes of the vibration substrate 21, the remaining one corresponding axes may be consistent with each other. Specifically, for example, as illustrated in FIG. 11, when the Y-axis and the Z-axis of the substrate 31 are inclined to the Y-axis and the Z-axis of the vibration substrate 21, the X-axis of the substrate 31 and the X-axis of the vibration substrate 21 may be consistent with each other. Further, regarding the mutual shifts of the crystal axis of the substrate 31 and the crystal axis of the vibration substrate 21, any one axis of the X-axis, the Y-axis, and the Z-axis may be shifted.

Further, in this embodiment, the vibration substrate 21 is formed of quartz crystal, but a constituent material of the vibration substrate 21 is not limited thereto. For example, the vibration substrate 21 may be formed of a piezoelectric single-crystalline body (a piezoelectric material of a single-crystalline body) such as lithium niobate, lithium tantalate, lithium tetraborate, rangarite, potassium niobate, or gallium phosphate, or may be formed of any of other piezoelectric single-crystalline bodies. However, it is preferable that the vibration substrate 21 is formed of the same material as that of the substrate 31. Thereby, it is possible to adjust the coefficient of thermal expansion, and thus stress is hardly generated.

The vibrator device 1 has been described in detail. As described above, the vibrator device 1 includes the base 51, the relay substrate 3 supported by the base 51, and the vibrator element 2 supported by the relay substrate 3. In addition, the vibrator element 2 includes the vibration substrate 21 formed of a piezoelectric single-crystalline body (quartz crystal in this embodiment), and the excitation electrodes 221 and 222 disposed in the vibration substrate 21. In addition, the relay substrate 3 includes the substrate 31 formed of a piezoelectric single-crystalline body (quartz crystal in this embodiment). The crystal axis of the substrate 31 and the crystal axis of the vibration substrate 21 are shifted from each other. Thereby, it is possible to separate mechanical resonance points of the vibration substrate 21 and the substrate 31 from each other as compared to, for example, a case where the crystal axes of the vibration substrate 21 and the substrate 31 are consistent with each other. For this reason, it is possible to suppress the occurrence of unintended vibration in the relay substrate 3 so as to resonate with the vibration of the vibrator element 2, and to effectively suppress the deterioration of vibration characteristics of the vibrator element 2 due to the vibration of the relay substrate 3. Therefore, the vibrator device 1 having excellent vibration characteristics is obtained.

In addition, as described above, in the vibrator device 1, a cut angle of the substrate 31 and a cut angle of the vibration substrate 21 are different from each other. Thereby, it is possible to simply and reliably shift the crystal axis of the substrate 31 and the crystal axis of the vibration substrate 21 from each other.

In addition, as described above, the substrate 31 is constituted by a Z cut quartz crystal substrate. Thereby, it is possible to form the substrate 31 with high dimensional accuracy.

In addition, as described above, the substrate 31 includes the supporting portion 32 (first portion) supported by the base 51, the first swing portion 33 (second portion), the beam portions 35 (first beam portions) connecting the supporting portion 32 and the first swing portion 33 to each other on the first axis L1, the second swing portion 34 (third portion), and the beam portions 36 (second beam portions) connecting the first swing portion 33 and the second swing portion 34 to each other on the second axis L2 intersecting the first axis L1. The vibrator element 2 is supported by the second swing portion 34. Thereby, it is possible to effectively increase a transmission length of stress from the supporting portion 32 to the second swing portion 34, and thus stress caused by the deformation of the base 51, or the like is hardly transmitted to the vibrator element 2.

In addition, as described above, the relay substrate 3 includes the wirings 38 and 39 disposed on the substrate 31. In addition, the wirings 38 and 39 are electrically connected to the excitation electrodes 221 and 222. Thereby, the excitation electrodes 221 and 222 are easily led to the circuit element 4. However, the wirings 38 and 39 may be omitted, and the excitation electrodes 221 and 222 and the terminals 42 of the circuit element 4 may be connected to each other through, for example, a bonding wire. That is, the vibrator element 2 and the circuit element 4 may be electrically connected to each other without going through the relay substrate 3.

In addition, as described above, the vibrator device 1 includes the lid 52 (lid body) bonded to the base 51 so as to accommodate the vibrator element 2 and the relay substrate 3 between the base 51 and the lid 52. Thereby, it is possible to suitably protect the vibrator element 2 and the relay substrate 3 from an impact, dust, heat, humidity (moisture), and the like.

In addition, as described above, the vibrator device 1 includes the circuit element 4 which is supported by the base 51 and is electrically connected to the vibrator element 2. The relay substrate 3 is supported by the base 51 through the circuit element 4. Thereby, stress is hardly transmitted to the vibrator element 2. In addition, for example, it is possible to suitably use the vibrator device 1 as an oscillator by forming an oscillation circuit in the circuit element 4.

In addition, as described above, the circuit element 4, the relay substrate 3, and the vibrator element 2 are disposed so as to overlap each other when viewed in a plan view. Thereby, it is possible to suppress planar expansion of the vibrator device 1 and to achieve the miniaturization of the vibrator device 1.

Second Embodiment

Figure 12:
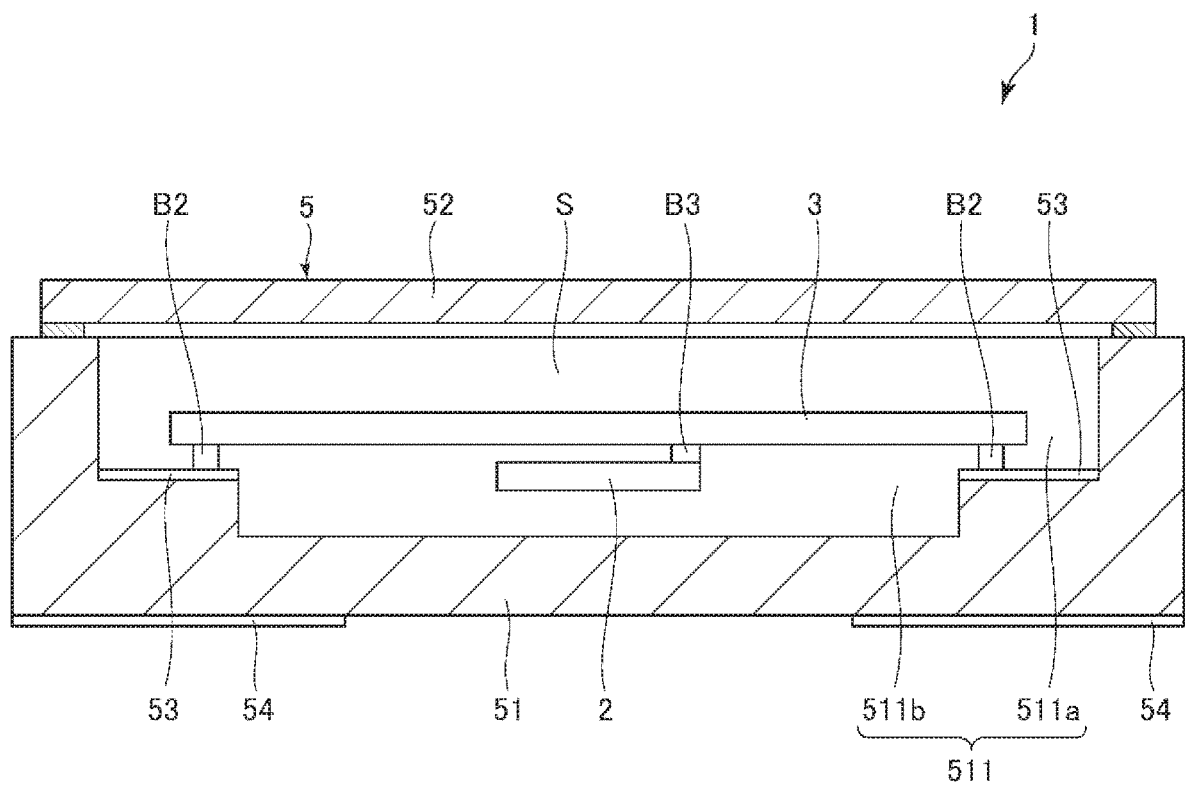
FIG. 12 is a cross-sectional view illustrating a vibrator device according to a second embodiment of the invention.
Figure 13:
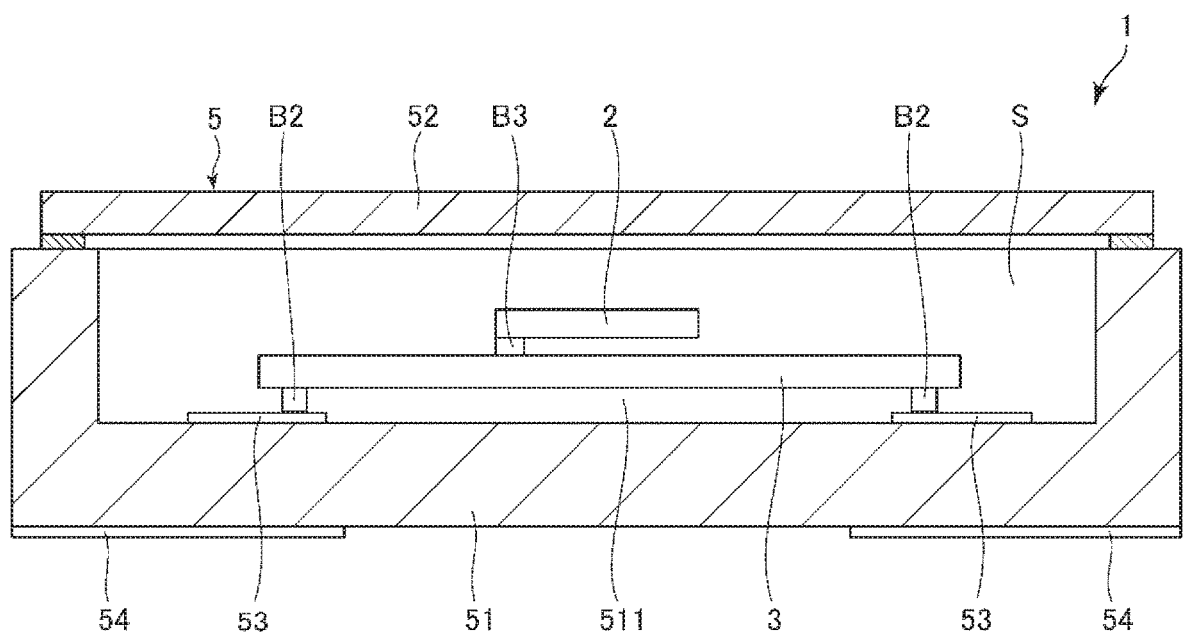
FIG. 13 is a cross-sectional view illustrating a modification example of the vibrator device illustrated in FIG. 12.
Figure 14:
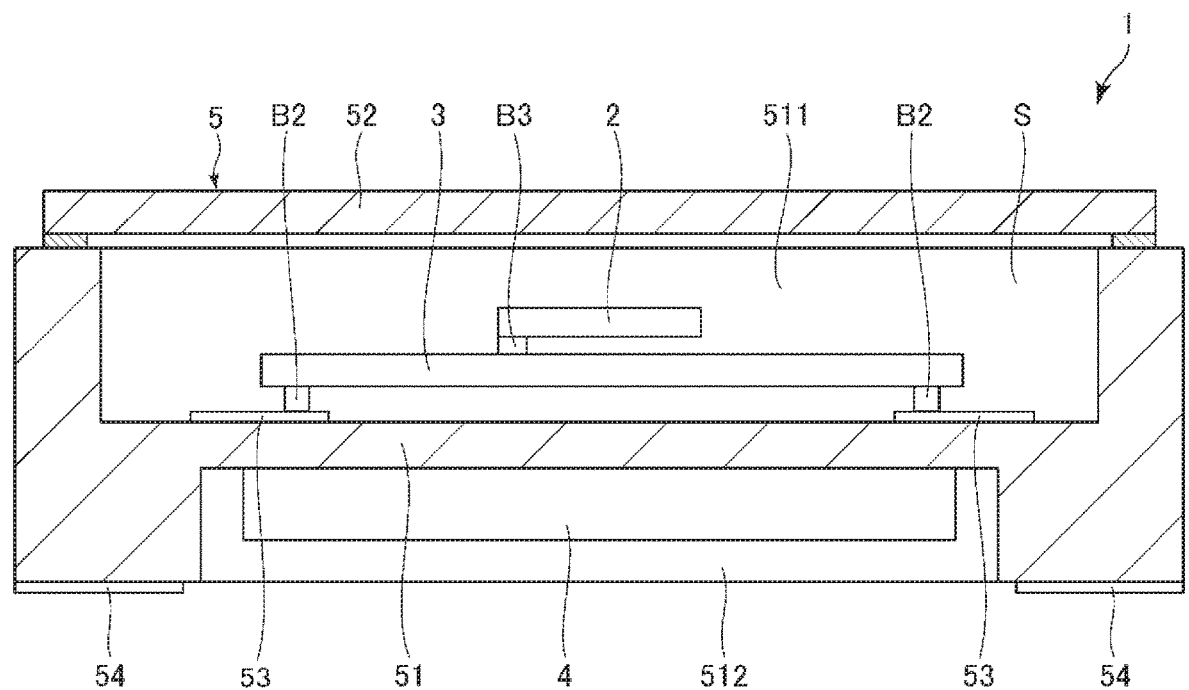
FIG. 14 is a cross-sectional view illustrating a modification example of the vibrator device illustrated in FIG. 12.

FIG. 12 is a cross-sectional view illustrating a vibrator device according to a second embodiment of the invention. FIGS. 13 and 14 are cross-sectional views illustrating a modification example of the vibrator device illustrated in FIG. 12.

The vibrator device according to this embodiment is mainly the same as the vibrator device of the above-described first embodiment except that the circuit element 4 is omitted. Meanwhile, in the following description, regarding the vibrator device of the second embodiment, differences from the above-described first embodiment will be mainly described, and the same matters will not be described. Further, in FIGS. 12 to 14, the same components as those in the above-described embodiment will be denoted by the same reference numerals and signs.

As illustrated in FIG. 12, in the vibrator device 1 of this embodiment, the circuit element 4 is omitted from the above-described first embodiment, and the relay substrate 3 is fixed to the bottom surface of the first concave portion 511a of the base 51 through the connection bumps B2. In addition, the wirings 38 and 39 are electrically connected to the predetermined internal terminal 53 through the connection bumps B2.

By the second embodiment, it is also possible to exhibit the same effects as those in the above-described first embodiment. Meanwhile, as a modification example of this embodiment, for example, as illustrated in FIG. 13, the relay substrate 3 may be fixed to the bottom surface of the concave portion 511 through the connection bumps B2. In addition, as illustrated in FIG. 14, the concave portion 512 is formed in the bottom surface of the base 51, and the circuit element 4 may be disposed in the bottom surface of the concave portion 512.

Third Embodiment

Next, an electronic apparatus according to a third embodiment of the invention will be described.

Figure 15:
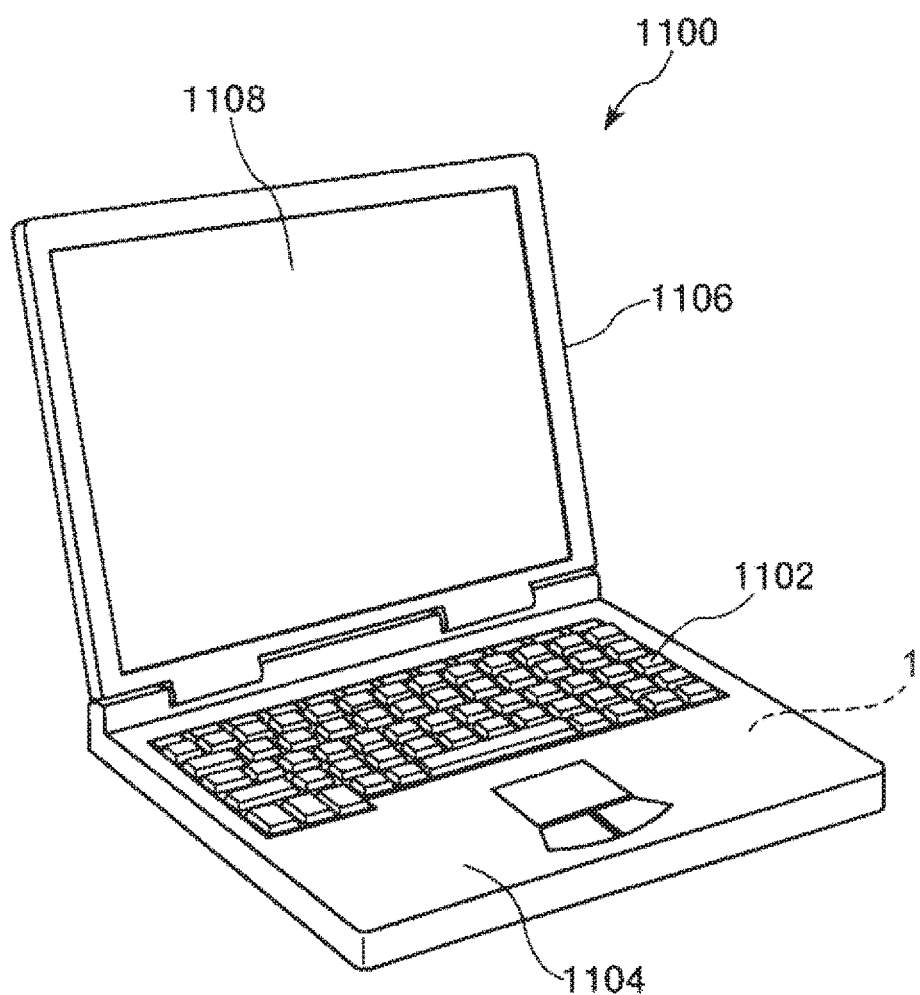
FIG. 15 is a perspective view illustrating an electronic apparatus according to a third embodiment of the invention.

FIG. 15 is a perspective view illustrating the electronic apparatus according to the third embodiment of the invention.

A mobile-type (or note-type) personal computer 1100 illustrated in FIG. 15 is a personal computer to which an electronic apparatus including the vibrator device according to the invention is applied. In this drawing, the personal computer 1100 includes a main body 1104 including a keyboard 1102 and a display unit 1106 including a display portion 1108, and the display unit 1106 is rotatably supported by the main body 1104 through a hinge structure portion. The vibrator device 1 used as, for example, an oscillator is embedded in the personal computer 1100.

The personal computer 1100 (electronic apparatus) includes the vibrator device 1. For this reason, it is possible to enjoy the effect of the above-described vibrator device 1 and to exhibit high reliability.

Fourth Embodiment

Next, an electronic apparatus according to a fourth embodiment of the invention will be described.

Figure 16:
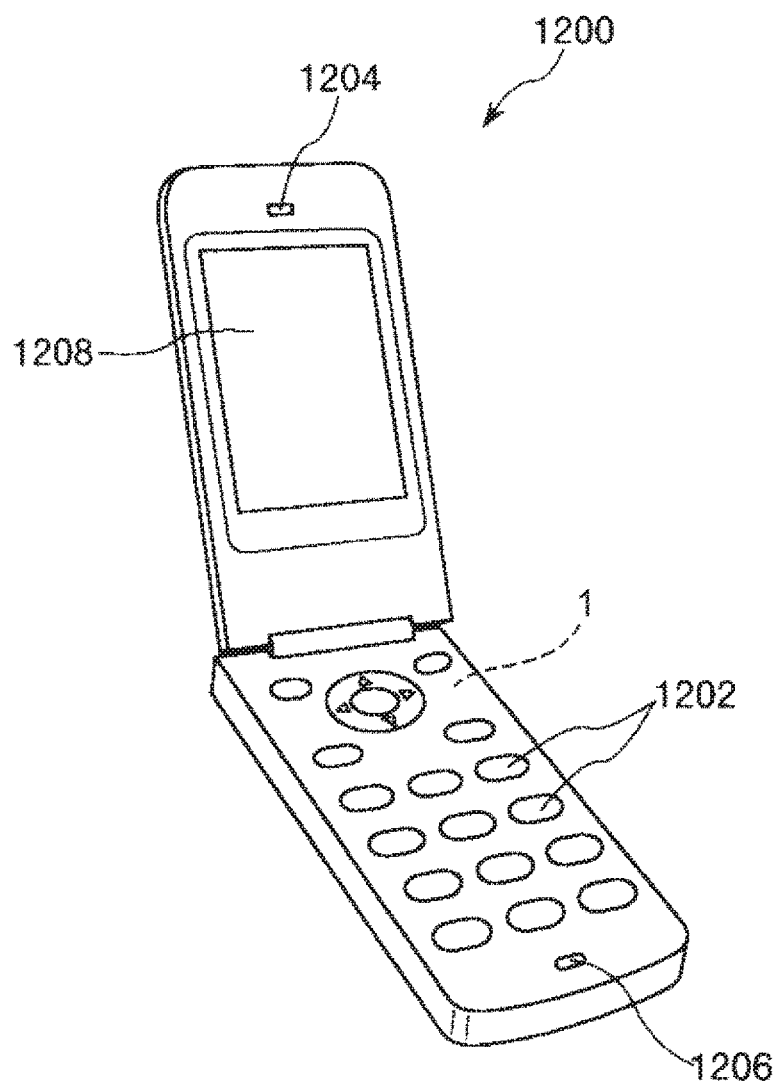
FIG. 16 is a perspective view illustrating an electronic apparatus according to a fourth embodiment of the invention.

FIG. 16 is a perspective view illustrating the electronic apparatus according to the fourth embodiment of the invention.

A mobile phone 1200 (a PHS is also included) illustrated in FIG. 16 is a mobile phone to which an electronic apparatus including the vibrator device according to the invention is applied. The mobile phone 1200 includes an antenna (not shown), a plurality of operation buttons 1202, an earpiece 1204, and a mouthpiece 1206, and a display portion 1208 is disposed between the operation buttons 1202 and the earpiece 1204. The vibrator device 1 used as, for example, an oscillator is embedded in the mobile phone 1200.

The mobile phone 1200 (electronic apparatus) includes the vibrator device 1. For this reason, it is possible to enjoy the effect of the above-described vibrator device 1 and to exhibit high reliability.

Fifth Embodiment

Next, an electronic apparatus according to a fifth embodiment of the invention will be described.

Figure 17:
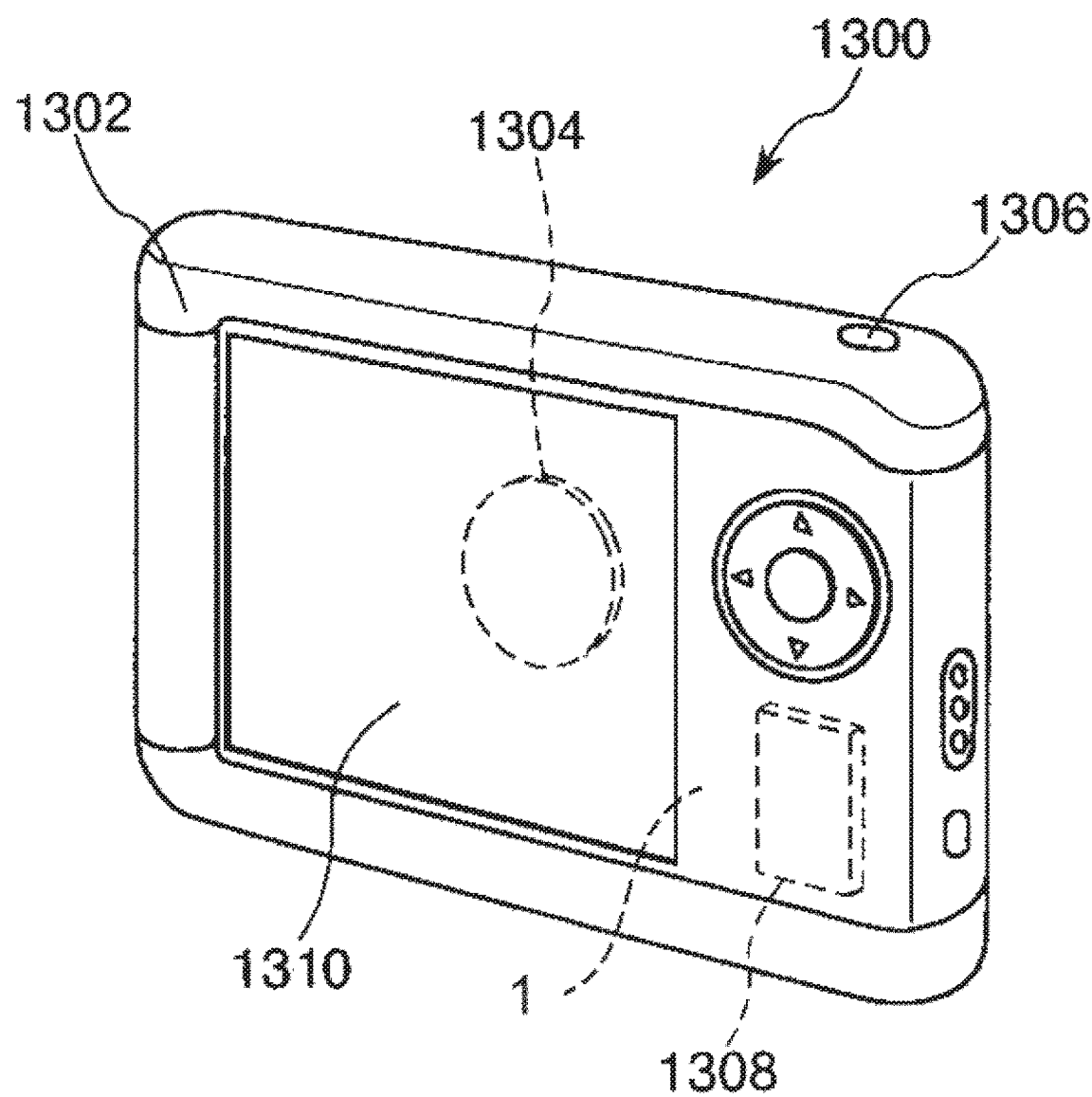
FIG. 17 is a perspective view illustrating an electronic apparatus according to a fifth embodiment of the invention.

FIG. 17 is a perspective view illustrating the electronic apparatus according to the fifth embodiment of the invention.

A digital steel camera 1300 illustrated in FIG. 17 is a camera to which an electronic apparatus including the vibrator device according to the invention is applied. The digital steel camera is configured such that a display portion 1310 is provided on the rear surface of a case (body) 1302 and display is performed on the basis of an imaging signal obtained by a CCD, and the display portion 1310 functions as a finder that displays a subject as an electronic image. In addition, a light-receiving unit 1304 including an optical lens (imaging optical system), a CCD, and the like is provided on the front side (the back side in the drawing) of the case 1302. A photographer confirms a subject image displayed on the display portion 1310. When the photographer presses a shutter button 1306, an imaging signal of the CCD at a point in time of the pressing is transmitted and stored in a memory 1308. The vibrator device 1 used as, for example, an oscillator is embedded in the digital steel camera 1300.

The digital steel camera 1300 (electronic apparatus) includes the vibrator device 1. For this reason, it is possible to enjoy the effect of the above-described vibrator device 1 and to exhibit high reliability.

Meanwhile, the electronic apparatus according to the invention can be applied not only to the above-described personal computer, mobile phone, and digital steel camera but also to a smartphone, a tablet terminal, a timepiece (a smart watch is included), an ink jet type discharge apparatus (for example, an ink jet printer), a laptop type personal computer, a television, and wearable terminals such as a head mounted display (HMD), a video camera, a video tape recorder, a car navigation apparatus, a pager, an electronic organizer (an electronic organizer with a communication function is also included), an electronic dictionary, an electronic calculator, an electronic game machine, a word processor, a workstation, a video phone, a television monitor for security, electronic binoculars, a POS terminal, medical equipment (for example, an electronic thermometer, a sphygmomanometer, a blood sugar meter, an electrocardiographic measurement device, an ultrasonic diagnostic apparatus, and an electronic endoscope), a fish detector, various measurement apparatuses, an apparatus for a moving terminal base station, instruments (for example, instruments for vehicles, aircraft, and ships), a flight simulator, a network server, and the like.

Sixth Embodiment

Next, a vehicle according to a sixth embodiment of the invention will be described.

Figure 18:
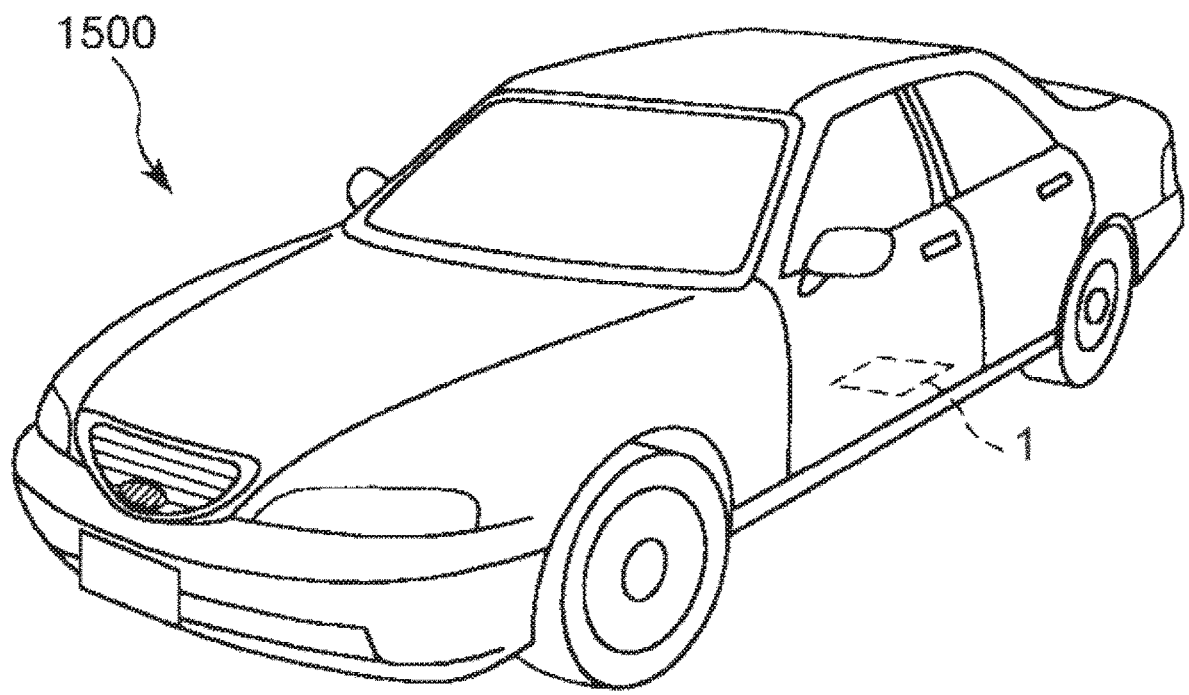
FIG. 18 is a perspective view illustrating a vehicle according to a sixth embodiment of the invention.

FIG. 18 is a perspective view illustrating a vehicle according to the sixth embodiment of the invention.

An automobile 1500 illustrated in FIG. 18 is an automobile to which a vehicle including the vibrator device according to the invention is applied. The vibrator device 1 used as, for example, an oscillator is embedded in the automobile 1500. The vibrator device 1 can be widely applied to an electronic control unit (ECU) such as a keyless entry, an immobilizer, a car navigation system, a car air-conditioner, an anti-lock brake system (ABS), an airbag, a tire pressure monitoring system (TPMS), an engine control, a battery monitor of a hybrid vehicle or an electric automobile, or a vehicle body position control system.

The automobile 1500 (vehicle) includes the vibrator device 1. For this reason, it is possible to enjoy the effect of the above-described vibrator device 1 and to exhibit high reliability.

Meanwhile, the vehicle is not limited to the automobile 1500, and can also be applied to an airplane, a ship, an Automated Guided Vehicle (AGV), a biped walking robot, and unmanned airplanes such as a drone.

The vibrator device, the electronic apparatus, and the vehicle according to the invention have been described on the basis of the embodiments illustrated in the drawing. However, the invention is not limited thereto, and a configuration of each portion can be replaced with any configuration having the same function. In addition, any other components may be added to the invention. In addition, the invention may be a combination of any two or more configurations (features) in the embodiments.

Further, in the above-described embodiments, a configuration in which the vibrator device is applied to an oscillator has been described. However, the invention is not limited thereto, and the vibrator device may be applied to a physical quantity sensor capable of detecting a physical quantity, such as an acceleration and an angular velocity. In this case, an element having a drive vibration mode and a detection vibration mode in which excitation occurs in accordance with a received physical quantity is used as the vibrator element 2, and a driving circuit for driving the vibrator element 2 in the drive vibration mode and a detection circuit detecting a physical quantity on the basis of a signal obtained from the detection vibration mode of the vibrator element 2 may be formed in the circuit element 4.

The entire disclosure of Japanese Patent Application No. 2017-228724, filed Nov. 29, 2017 is expressly incorporated by reference herein.

What is claimed is:

1. A vibrator device comprising:
   a base:
   a relay substrate that is supported by the base; and
   a vibrator element that is supported by the relay substrate,
   wherein the vibrator element includes a vibration substrate formed of a piezoelectric single-crystalline body and an excitation electrode disposed on the vibration substrate,
   the relay substrate includes a substrate formed of the piezoelectric single-crystalline body, and
   a crystal axis of the substrate and a crystal axis of the vibration substrate are shifted from each other.

2. The vibrator device according to claim 1,
   wherein a cut angle of the substrate and a cut angle of the vibration substrate are different from each other.

3. The vibrator device according to claim 2,
   wherein the substrate is constituted by a Z cut quartz crystal substrate.

4. The vibrator device according to claim 1,
   wherein the substrate includes
   a first portion that is supported by the base, a second portion, a first beam portion that connects the first portion and the second portion to each other on a first axis, a third portion, and a second beam portion that connects the second portion and the third portion to each other on a second axis intersecting the first axis, and the vibrator element is supported by the third portion.

5. The vibrator device according to claim 1, wherein the relay substrate includes a wiring disposed in the substrate, and the wiring is electrically connected to the excitation electrode.

6. The vibrator device according to claim 1, further comprising:

a lid body that is bonded to the base so as to accommodate the vibrator element and the relay substrate between the base and the lid body.

7. The vibrator device according to claim 1, further comprising:

a circuit element that is supported by the base and is electrically connected to the vibrator element, wherein the relay substrate is supported by the base through the circuit element.

8. The vibrator device according to claim 7, wherein the circuit element, the relay substrate, and the vibrator element are disposed so as to overlap each other when viewed in a plan view.

9. An electronic apparatus comprising the vibrator device according to claim 1.

10. A vehicle comprising the vibrator device according to claim 1.

* * * * *